United States Patent [19]

Garg et al.

[11] Patent Number: 4,945,640
[45] Date of Patent: Aug. 7, 1990

[54] WEAR RESISTANT COATING FOR SHARP-EDGED TOOLS AND THE LIKE

[76] Inventors: Diwakar Garg, 2815 Whitemarsh Pl., Macungie, Pa. 18062; Carl F. Meuller, 1221 Tatamy Rd., Easton, Pa. 18042; Ernest L. Wrecsics, 6077 Weaversville Rd., Bethlehem, Pa. 18017; Paul N. Dyer, 3920 Pleasant Ave., Allentown, Pa. 18103; Mark A. Pellman, 2908 Lindbergh St., Orefield, Pa. 18069

[21] Appl. No.: 319,774

[22] Filed: Mar. 7, 1989

Related U.S. Application Data

[63] Continuation-in-part of Ser. No. 92,809, Sep. 3, 1987, Pat. No. 4,874,642, and a continuation-in-part of Ser. No. 153,738, Feb. 8, 1988, Pat. No. 4,855,188.

[51] Int. Cl.$^5$ .............................................. B26B 9/00
[52] U.S. Cl. ...................................... 30/350; 76/104.1
[58] Field of Search ................ 30/350, 346.54, 346.53, 30/346.55; 76/104

[56] References Cited

U.S. PATENT DOCUMENTS

| | | | |
|---|---|---|---|
| 3,368,914 | 2/1968 | Darnell et al. | 117/71 |
| 3,389,977 | 6/1968 | Tarver | 29/198 |
| 3,496,973 | 2/1970 | Ballard | 30/350 X |
| 3,574,672 | 4/1971 | Tarver | 117/106 |
| 3,721,577 | 3/1973 | Woerner | 117/46 |
| 3,814,625 | 6/1974 | Lewin et al. | 117/71 |
| 3,911,579 | 10/1975 | Lane et al. | 30/346.54 |
| 4,008,976 | 2/1977 | Holzl | 408/144 |
| 4,162,345 | 7/1979 | Holzl | 428/328 |
| 4,427,455 | 1/1984 | Schepper | 134/22 |

FOREIGN PATENT DOCUMENTS 1326769 of 0000 United Kingdom .
1540718 of 0000 United Kingdom .

Primary Examiner—Douglas D. Watts
Assistant Examiner—Willmon Fridie, Jr.
Attorney, Agent, or Firm—Richard A. Dannells, Jr.; James C. Simmons; William F. Marsh

[57] ABSTRACT

A method is described for improving the erosion and abrasion resistance of a sharp edged metal structure. A base layer of a noble metal is formed on the surface of the body of the structure followed by a chemical vapor deposited outer coating comprising a mixture of tungsten and tungsten carbide. The tungsten carbide is selected from the group consisting of $W_2C$, $W_3C$, and mixtures thereof and is fine grained, non-columnar and having a substantially layered microstructure. Also described is a sharp edged metal structure formed by the method.

13 Claims, 1 Drawing Sheet

WEAR RESISTANT COATING FOR SHARP-EDGED TOOLS AND THE LIKE

This application is a Continuation-in-Part of U.S. application Ser. No. 07/092,809, filed Sept. 3, 1987, now U.S. Pat. No. 4,874,642, issued Oct. 17, 1989 and U.S. application Ser. No. 07/153,738, filed Feb. 8, 1988, now U.S. Pat. No. 4,855,188, issued Aug. 8, 1989.

This invention relates generally to sharp edged metal structures such as cutting tools or the like in which a sharp edge is defined by one or more surfaces of a metal body. More particularly, the invention relates to a method for improving the abrasion, erosion and wear resistance of sharp edged metal structures, and to a sharp edged metal structure having improved erosion and wear resistance.

BACKGROUND OF THE INVENTION

Sharp edged metal structures, such as cutting tools, are typically comprised of a body having a sharp edge defined by at least one surface of the body. For example, a punch typically has a sharp edge or point defined by a conical surface. Other sharp edges may be linear or curved and be defined by the intersection of two or more surfaces. In some cases, such as the case of forming tools, the surfaces may be of irregular contour. In other cases, such as in the case of drills, the surfaces may be of a uniform contour.

Many techniques have been employed for lengthening the life of cutting tools. Such techniques include the manufacture of the tool out of a long life material such as high speed steels or cemented tungsten carbide. Surface hardening techniques used to improve tool life such as case hardening have been commonly applied, but such techniques do not provide sufficient improvement in tool life to meet the current needs of industry. Hard coatings such as chemically vapor deposited titanium carbide and titanium nitride have also been tried with no success because of the degradation of the mechanical properties and deformation of the parts by high temperatures ($\sim 900°$ C.) used during the deposition process.

The thermochemically deposited coatings described in U.S. Pat. No. 4,008,976 issued Feb. 22, 1977 to Holzl have also been tried to prolong the tool life. In that patent, a coating of very substantial thickness is deposited on a tool body and a cutting edge is subsequently machined in the deposited layer. Unfortunately, machining of such high hardness material may be difficult and may, in many instances, undesirably increase the cost of the tool. Although very thin coatings of this nature have also been attempted on cutting tools and the like, such coatings have not been successful. This is because, in many instances, deposition of such coatings requires very high temperature, causing degradation of the mechanical properties and deformation of the parts. Differences in coefficients of thermal expansion between the substrate and the coating also results in poor coating adhesion.

U.S. Pat. No. 4,162,345, issued July 24, 1979 to Robert A. Holzl, discloses a method for producing deposits characterized by a structure which is free of columnar grains and instead consists essentially of fine, equiaxial grains. These deposits have unusually high hardness and tensile strength. However, the Holzl '345 patent discloses use of temperatures varying from 650° C., to 1,100° C., which are high enough to degrade the mechanical properties and deformation (or mechanical distortion) of metallic substrates. The material of Holzl '345 patent is a hard metal alloy, consisting primarily of tungsten and carbon. X-ray diffraction analysis of the '345 alloy shows that the deposit is akin to tungsten but with a very finely dispersed carbide, probably in the form of WC.

U.S. Pat. No. 4,427,445, issued Jan. 24, 1984 to Robert A. D Holzl, et al. also discloses a hard fine grained material which can be produced by thermochemical deposition, but at temperatures lower than those described in the example of the '345 patent. Thus, where there are large differences in the thermal coefficients of expansion between the substrate material and the coating material, the '445 methodology reduces adhesion problems and problems associated with mechanical distortion, metallurgical transformation or stress relief of the substrate. The material of the 445 'Holzl, et al. patent is a tungsten carbon alloy consisting primarily of a two phase mixture of substantially pure tungsten and an A15 structure.

U.S. Pat. No. 3,368,914, discloses a process for adherently depositing tungsten carbide of substantial thickness on steel and other metal substrates. The process involves first diffusing another metal on the surface of the substrate to relax the thermal expansion coefficient zone of the metal substrate. The carbide coating is then deposited on the diffused surface by CVD. The process claims it is preferable to diffuse the metal forming the carbide into the substrate. In one embodiment of the claimed process, a thin layer of tungsten is deposited on the metal surface using 600°–1000° C. temperature. After coating tungsten, the temperature is increased to approximately 1000°–1200° C. and held there for a significant period of time to permit diffusion of tungsten into the metal. The diffused surface is then coated with tungsten carbide using $WF_6$, CO and $H_2$. In the alternative embodiment, a pack diffusion technique is used for achieving diffusion of tungsten into metal. Temperature ranging from 1000°–1200° C. is used in the pack diffusion step. The diffused metal surface is then coated with tungsten carbide. Since a temperature ranging from 1000°–1200° C. is used during the process, the '914 process is not suitable for providing erosion and wear resistance coatings on various metallic substrates without severely distorting and degrading their mechanical properties.

U.S. Pat. No. 3,389,977, discloses a method of depositing substantially pure tungsten carbide in the form of $W_2C$, free from any metal phase. Pure $W_2C$ is deposited on a substrate by reacting $WF_6$ and CO. The substrate is heated to a temperature in excess of 400° C. The adherence of $W_2C$ to steel is improved by first cleaning the surface and then depositing with a thin film of tungsten followed by $W_2C$ using a temperature ranging from 600°–1000° C. Since initial deposition of tungsten is conducted at or above 600° C., the '977 process is not suitable for providing erosion and wear resistance coating on various carbon steels, stainless steels, nickel and titanium alloys without severely degrading their mechanical properties. Additionally pure $W_2C$ deposited according to the teachings of the '977 patent consists of columnar grains. The '977 patent does not describe a process for depositing $W_2C$ coating in non-columnar fashion.

U.S. Pat. No. 3,574,672 discloses a process for depositing $W_2C$ by heating a substrate to a temperature between 400°–1300° C. The process described in this patent is essentially the same as disclosed in U.S. Pat. No. 3,389,977.

U.S. Pat. No. 3,721,577 discloses a process for depositing refractory metal or metal carbides on ferrous and non-ferrous base materials heated to at least 1050° C. The metal carbides are deposited using halide vapors of the metal along with methane and hydrogen.

U.S. Pat. No. 3,814,625 discloses a process for the formation of tungsten and molybdenum carbide by reacting a mixture of $WF_6$ or $MoF_6$, benzene, toluene or xylene and hydrogen. The process is carried out under atmospheric pressure and temperatures ranging from 400°–1000° C. An atomic ratio of W/C in the gaseous mixture varying from 1 to 2 is required to yield $W_2C$. The process also suggests that for some substrates such as mild steel, it is advantageous in providing better adhesion to deposit a layer of nickel or cobalt prior to tungsten carbide deposition. The process also claims the formation of a mixture of tungsten and tungsten carbide in the presence of large proportions of free hydrogen. The mixture of W and $W_2C$ coating deposited according to the teaching of the '625 patent consists of columnar grains. The '625 patent does not disclose a process for depositing a mixture of W and $W_2C$ in non-columnar fashion.

British Pat. No. 1,326,769 discloses a method for the formation of tungsten carbide by reacting a mixture of $WF_6$, benzene, toluene or xylene and hydrogen under atmospheric pressure and temperatures ranging from 400°–1000° C. The process disclosed in this patent is essentially the same as disclosed in U.S. Patent No. 3,814,615.

British Patent No. 1,540,718 discloses a process for the formation of $W_3C$ using a mixture of $WF_6$, benzene, toluene or xylene and hydrogen under sub-atmospheric pressure and temperature ranging from 350°–500° C. An atomic ratio of W/C in the gaseous mixture varying from 3–6 is required to yield $W_3C$. The coating deposited according to the teaching of British Pat. No. 1,540,718 consists of columnar grains. The British '718 patent does not teach a process for depositing a non-columnar coating.

Although the methods of the Holzl patents cited above have been useful in producing fine-grained tungsten/carbon alloys containing mixtures of W and WC, and W and A15 structure, and the methods described in other cited patents have been successful in producing columnar $W_3C$ or $W_2C$ or mixtures of W and $W_2C$, no one has yet disclosed a method for producing extremely hard, fine-grained, non-columnar tungsten-carbon alloys with substantially layered microstructure containing mixtures of tungsten and tungsten carbide in the form of $W_2C$ or $W_3C$ or a mixture of $W_2C$ and $W_3C$. Such alloys would be especially useful since the presence of $W_2C$ and/or $W_3C$ in non-columnar and substantially layered microstructure would contribute to both the hardness and the tensile strength of the deposited materials.

In co-pending U.S. application Ser. No. 07/092,809, a method and coating are described comprising a non-columnar, fine grained, and having a substantially layered microstructure deposit of tungsten carbide in the form $W_2C$, $W_3C$ or mixtures of $W_2C$ and $W_3C$. In co-pending U.S. application Ser. No. 07/153,738 such coatings are described in which an intermediate layer of substantially pure tungsten is used between the substrate and the tungsten carbide outer layer to confer additional erosive, abrasion and wear resistance characteristics on the composite coating system. The present invention is an improvement on such prior described coating systems wherein such systems are applied at low temperatures to a sharp edged metal structure such as a cutting tool or the like without distorting, deforming and degrading their mechanical properties. It has been found that by controlling the thickness of such coating systems, they can be applied without significantly altering the original machined configuration of the sharp edged metal structure. It has also been found that such coating systems can confer substantial abrasion, erosion and wear characteristics on such structures.

SUMMARY OF THE INVENTION

Very generally, the invention improves the erosion and abrasion wear resistance of sharp edged metal structures, such as cutting tools and the like. The surface or surfaces which define the sharp edge are provided with a base layer of a noble metal having a thickness sufficient to protect the surface against corrosion during chemical vapor deposition. This is followed by the chemical vapor deposition of an outer coating comprising a mixture of tungsten and tungsten carbide in the form $W_2C$, $W_3C$, or mixtures of $W_2C$ and $W_3C$. The outer coating is fine-grained, non-columnar and has a substantially layered microstructure with a thickness selected to confer the desired erosion and abrasion wear resistance on the sharp edge, while retaining the desired sharpness. An interlayer of substantially pure tungsten may be provided by chemical vapor disposition technique between the base layer and the outer coating to improve adhesion and performance.

DETAILED DESCRIPTION OF THE INVENTION

Figure 1:
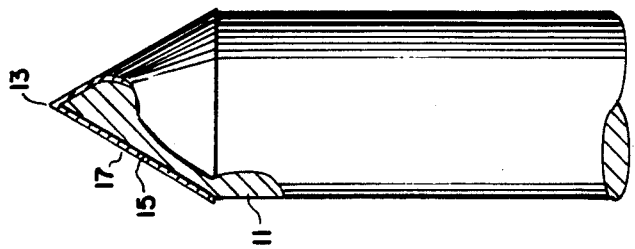
FIG. 1 is a quarter section view of a single point cutting tool of a type to which the invention is applicable.

Referring now particularly to FIG. 1, a sharp edged metal structure comprising a single point cutting tool, such as a punch, is shown in quarter cross section. The structure includes a generally cylindrical tool body 11 which tapers to a cutting edge or point 13 defined by a conical surface 15. The conical surface is provided with a highly erosion and abrasion wear resistant coating system 17 on the surface 15. The coating system 17, described with particularity below, extends over the point 13 and confers longer tool life as a result of high erosion and abrasion wear resistance.

Figure 2:
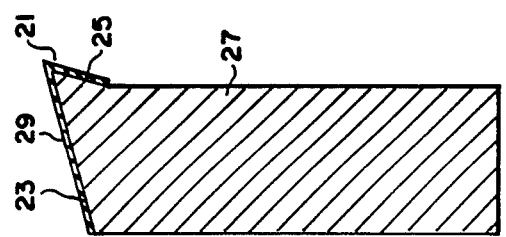
FIG. 2 is a full section view of another type of cutting tool to which the invention is applicable.

Referring to FIG. 2, another type of sharp edge metal structure is illustrated. FIG. 2 represents a full cross-section of a cutting tool in which a linear sharp edge 21 is defined by two intersecting planar surfaces 23 and 25 of a tool body 27. Both surfaces 23 and 25 are provided with a highly erosion and abrasion wear resistant coating 29 which covers the edge 21 to provide improved tool life.

It will be apparent to those skilled in the art, particularly from the discussion set forth below, that coating systems in accordance with the invention may be provided on other types of sharp edged metal structures in addition to those shown in FIGS. 1 and 2. Thus, the structures illustrated in FIGS. 1 and 2 are for the purposes of illustration only and are not meant to restrict the invention to the particular configuration shown. The invention is applicable to other types of sharp edged metal structures, such as drills, forming tools, knives, sharpening blades, saw blades, reamers, and the like.

Figure 3:
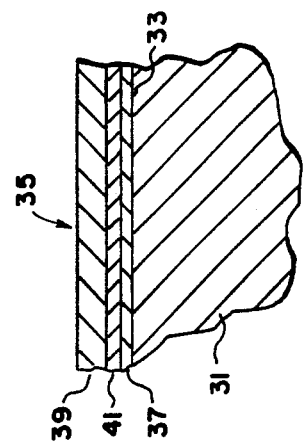
FIG. 3 is a full section greatly enlarged view illustrating a coating system in accordance with the invention.

Referring now to FIG. 3, a preferred form of the coating system illustrated as 17 in FIG. 1 and as 29 in FIG. 2 is illustrated. The tool body is represented as 31 and a coated surface thereof is illustrated at 33. The coating system is illustrated generally at 35.

In FIG. 3, the coating system is comprised of a base layer 37 of a noble metal. The noble metal may be of any suitable type, such as nickel, cobalt, copper, silver, gold, platinum, palladium, irridium, and mixtures thereof and may be deposited by suitable technique, such as by electrochemical deposition, electroless plating or physical vapor deposition such as sputtering. The thickness of the base layer 37 is selected to be sufficient to protect the part from the attack of corrosive gases typically generated during the chemical vapor deposition process. The required thickness will be determined by the nature of the substrate and the deposition conditions utilized in the chemical vapor deposition process.

Following formation of the base layer 37, an outer coating 39 is provided. In some cases the coating 39 may be provided directly on the base layer 37. In other cases, however, an interlayer 41 may also be provided interposed between the base layer 37 and the outer coating 29. The interlayer is comprised of substantially pure tungsten and is for the purpose of providing good adhesion between the outer coating and the base layer and to further improve the erosion and abrasion wear resistance of the coating system. Both the interlayer 41 and the outer coating 39 are deposited by chemical vapor deposition.

The outer coating 39 comprises a mixture of tungsten and tungsten carbide. The tungsten carbide may be $W_2C$, $W_3C$, or a mixture of $W_2C$ and $W_3C$. The coating 39 is fine grained, non-columnar and has a substantially layered microstructure and a thickness sufficient to provide the desired degree of erosion and abrasion wear resistance. This desired degree will depend upon the configuration of the sharp edged metal structure and the use for which the sharp edged metal structure is employed. The thickness of the coating system 35 must, of course, be less than would seriously degrade the cutting performance of the sharp edge.

The manner in which such coating is achieved is described in detail in co-pending U.S. Pat. applications Ser. No. 07/092,809, filed 3 Sept. 1987 and U.S. application Ser. No. 07/153,738, filed 8 Feb. 1988. The respective disclosures thereof are incorporated herein by reference. In both those cases, composite coating systems of the type described herein are set forth in detail along with the manner by which such coatings are produced.

The thickness of the coatings, as described above, will vary depending upon the conditions and purpose for which the sharp edged metal structure is used.

It is preferred, however, that the coating system comprise a base noble metal layer having a thickness between about 0.05 microns and about 2 microns, and an outer coating having a thickness between about 1 micron and about 5 microns. In the event an interlayer 41 is employed, it is preferred that the interlayer be of a thickness in the range from about 0.05 microns to about 5 microns.

EXAMPLES

For the purposes of further illustrating the invention, the following examples are provided:

EXAMPLE 1

Seven ⅛"×⅛"×6" long lead pointer blade sticks made of steel were provided with the hard coating system described above. The sticks were first plated with ~1μm thick base layer of nickel using electrolytic plating technique. They were then placed in an inductively heated graphite furnace inside a gas-tight quartz envelope and heated to ~460° C. in the presence of flowing argon gas. At that temperature, a gaseous mixture of 125 sccm of $WF_6$, 1,250 sccm of hydrogen, and 11,900 sccm of argon was passed into the furnace over the specimens for 5 minutes to coat them with tungsten. After coating the specimens with tungsten for 5 minutes, a gaseous mixture of 300 sccm of $WF_6$, 3,000 sccm of $H_2$, 3.500 sccm of argon, and 95 sccm of DME (dimethylether) was passed into the furnace for 20 minutes to provide a tungsten/tungsten carbide coating. A total pressure was maintained at 40 torr during tungsten as well as tungsten/tungsten carbide coating steps.

The sticks were coated with 3 to 3.5 μm thick interlayer of tungsten followed by 4.8 to 5.4 μm thick hard tungsten/tungsten carbide coating. Additionally, the coated sticks retained the sharp edges.

EXAMPLE 2

A lead pointer blade stick coated as in Example 1 was cut into several ~½" long sections. Four of these ~½" long sections were used in a drafting pencil sharpener. The sharpness of the blades was determined by monitoring the feed rate of hard drafting pencil lead to the sharpener. In the case of the blades which were uncoated but hardened, the feed rate decreased by feeding only 1-2 sections of 2" long hard lead. The decrease in the feed rate was indicative of blunting of the sharp edges. In the case of the coated blades, no decrease in the feed rate was observed even after feeding 3 sections of 2" long hard lead. This indicated that the coating did not degrade the sharpness of the edges. Additionally, it indicated that the coating helped in retaining sharpness of the edges longer.

EXAMPLE 3

Another lead pointer blade stick coated in Example 1 was cut into several ~½" long sections. Four of these ~½ long sections were used in a drafting pencil sharpener and tested for longevity. Again, several 2" long hard lead sections were fed to the sharpener to establish the useful life. The test results showed that the coating increased the life of the blades by an order of magnitude. The results also showed that the tungsten/tungsten carbide coating increased the life by 4 to 5 times over blades coated with hard chrome. The test results therefore demonstrated the superior performance of the coated blades over uncoated but hardened ones and those coated with hard chrome.

EXAMPLE 4

Several ⅛"×⅛"×6" long lead pointer blade sticks are provided with a hard coating according to the invention. The sticks are first plated with ~1 μm thick nickel using electrolytic or electroless technique. The sticks are then placed in an inductively heated graphite furnace inside a gas-tight quartz envelope and heated to ~460° C. in the presence of flowing argon gas. At the temperature a gaseous mixture of 300 sccm of WF$_6$, 3,000 sccm of H$_2$, 3,500 sccm of argon, and 95 sccm of DME is passed into the furnace for 20 minutes to provide ~5 μm thick tungsten/tungsten carbide coating. A total pressure is maintained at 40 torr during the coating step. The coated blades are expected to increase the useful life by an order of magnitude over uncoated ones.

EXAMPLE 5

A number of surgical needles made of SS-420 stainless steel were deposited with the hard coating. The needles were plated with 1-3 νm thick nickel using electrolytic technique. They were then placed in an inductively heated graphite furnace inside a gas-tight quartz envelope and heated to ~460° C. in the presence of flowing argon gas. At the temperature a gaseous mixture of 100 sccm of WF$_6$, 1,000 sccm of H$_2$, and 12,200 sccm of argon was passed into the furnace over the specimens for 7 minutes to deposit a tungsten interlayer. After depositing tungsten for 7 minutes, a gaseous mixture of 300 sccm of WF$_6$, 3.000 sccm of H$_2$, 3,200 sccm of argon and 95 sccm of DME was passed into the furnace for 15 minutes to provide tungsten/tungsten carbide outer coating. A total pressure was maintained at 40 torr during tungsten as well as tungsten/tungsten carbide coating steps. The needles were coated with a thin interlayer of tungsten followed by the tungsten/tungsten carbide outer coating. A superior wear resistant needle was thus produced.

EXAMPLE 6

A number of surgical needles made of SS-420 stainless steel are deposited with the hard coating. The needles are plated with 0.05 to 1μm thick nickel using electrolytic or electroless technique. They are then placed in an inductively heated graphite furnace inside a gas-tight quartz envelope and heated to ~460° C. in the presence of flowing argon gas. At the temperature a gaseous mixture of 300 sccm of WF$_6$, 3,000 sccm of H$_2$, 3,200 sccm of argon and 95 sccm of DME is passed into the furnace for 15 minutes to provide thin tungsten/tungsten carbide coating. A total pressure is maintained at 40 torr during the coating step.

It will be seen, therefore, that the present invention increases the useful life of sharp edged metal structures, such as cutting tools and the like, made of ferrous and non-ferrous metals and alloys. In accordance with the invention a hard, fine-grained, non-columnar tungsten carbide coating system having a substantially layered microstructure is provided using a chemical vapor deposition technique. The surface or surfaces which define the sharp edge are coated while at the same time the sharp edge is maintained. Parts used in various low load applications, such as knives, pencil sharpener blades, surgical needles, forming tools, etc. are particularly susceptible to improvement utilizing the invention. D
Various modifications of the invention in addition to those shown and described herein will become apparent to those skilled in the art from the foregoing description and accompanying drawings. Such modifications are intended to fall within the scope of the appended claims.

What is claimed is:

1. A method for increasing the wear life of a sharp edged metal structure such as a cutting tool or the like wherein said sharp edge is defined by at least one surface, said method comprising the steps of: providing a base layer of a noble metal on said surface, said base layer having a thickness sufficient to protect said surface from corrosion during chemical vapor deposition, and chemically vapor depositing an outer coating comprising a mixture of tungsten and tungsten carbide wherein said tungsten carbide is selected from the group consisting of W$_2$C, W$_3$C and mixtures of W$_2$C and W$_3$C, said outer coating being fine grained, non-columnar and having a substantially layered microstructure and a thickness sufficient to confer a desired degree of wear resistance on said sharp edge while retaining the desired sharpness.

2. A method according to claim 1 wherein the thickness of said base layer is between about 0.05 microns and 2 microns, and wherein the thickness of said outer coating is between about 1 micron and about 5 microns.

3. A method according to claim 1 wherein the thickness of said outer coating is greater than the thickness of said base layer.

4. A method for increasing the wear life of a sharp edged metal structure such as a cutting tool or the like wherein said sharp edge is defined by at least one surface, said method comprising the steps of: providing a base layer of a noble metal on said surface, said base layer having a thickness sufficient to protect said surface from corrosion during chemical vapor deposition, chemically vapor depositing an interlayer substantially pure tungsten on said base layer, and chemically vapor depositing an outer coating comprising a mixture of tungsten and tungsten carbide wherein said tungsten carbide is selected from the group consisting of W$_2$C, W$_3$C and mixtures of W$_2$C and W$_3$C, said outer coating being fine grained, non-columnar and having a substantially layered microstructure and a thickness sufficient to confer a desired degree of wear resistance on said sharp edge.

5. A method according to claim 4 wherein the thickness of said interlayer is at least about 30% of the thickness of said outer coating.

6. A method according to claim 1 wherein said noble metal is selected from the group consisting of nickel, cobalt, copper, silver, gold, platinum, palladium, irridium, and mixtures thereof.

7. A method according to claim 1 wherein said base layer is deposited by means of electrochemical or electroless plating technique.

8. A sharp edged metal structure comprising, a body having a sharp edge formed therein, said sharp edge being defined by at least one surface of said body, and a highly erosion and abrasion wear resistant coating system on said one surface, said coating system comprising a base layer of a noble metal on said surface having a thickness sufficient to protect said surface from corrosion during chemical vapor deposition, an outer coating comprising a mixture of tungsten and tungsten carbide wherein said tungsten carbide is selected from the group consisting of W$_2$C, W$_3$C, and mixtures of W$_2$C and W$_3$C, said outer coating being fine grained, non-columnar and having a substantially layered microstructure and a thickness sufficient to confer a desired level of abrasion and wear resistance to said sharp edged metal structure and an interlayer between said base layer and said outer coating, said interlayer comprising substantially pure tungsten having a thickness of at least about 30% of the thickness of said outer coating.

9. A metal structure according to claim 8 wherein said base layer is of a thickness between about 0.05 microns and about 2 microns, and wherein said outer coating is of a thickness of between about 1 micron and about 5 microns.

10. A metal structure according to claim 8 wherein said noble metal is selected from the group consisting of nickel, cobalt, copper, silver, gold, platinum, palladium, irridium, and mixtures thereof.

11. A metal structure according to claim 8 wherein said interlayer is of a thickness between about 0.5 microns and 5 microns.

12. A metal structure according to claim 8 wherein said structure comprises a cutting tool, and wherein said sharp edge comprises a cutting edge defined by at least two intersecting surfaces.

13. A metal structure according to claim 8 wherein said sharp edged metal structure comprises a cutting tool, and wherein said sharp edge comprises a point defined by a substantially conical surface.

* * * * *